(12) United States Patent
Sakai et al.

(10) Patent No.: US 9,608,404 B2
(45) Date of Patent: Mar. 28, 2017

(54) CONSTANT CURRENT CONTROL POWER SUPPLY AND LASER OSCILLATOR

(71) Applicant: FANUC CORPORATION, Minamitsuru-gun, Yamanashi (JP)

(72) Inventors: Yoshinori Sakai, Yamanashi (JP); Shuuji Kudou, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 15/077,103

(22) Filed: Mar. 22, 2016

(65) Prior Publication Data

US 2016/0285389 A1 Sep. 29, 2016

(30) Foreign Application Priority Data

Mar. 23, 2015 (JP) .................................. 2015-059639

(51) Int. Cl.
*H01S 3/00* (2006.01)
*H01S 5/042* (2006.01)
*H01S 5/026* (2006.01)
*H01S 3/091* (2006.01)
*H01S 3/13* (2006.01)
(Continued)

(52) U.S. Cl.
CPC ............ *H01S 5/042* (2013.01); *H01S 3/0912* (2013.01); *H01S 3/10015* (2013.01); *H01S 3/1305* (2013.01); *H01S 5/0261* (2013.01); *H02M 7/217* (2013.01); *H02M 2001/0009* (2013.01)

(58) Field of Classification Search
CPC ...... H01S 5/042; H01S 3/1305; H01S 5/0261; H01S 3/10015; H01S 3/0912; H02M 7/217; H02M 2001/0009
See application file for complete search history.

(56) References Cited

U.S. PATENT DOCUMENTS

2001/0047982 A1* 12/2001 Watanabe ............ B23K 11/257
219/110
2009/0207871 A1* 8/2009 Koshimae ............. H01S 3/0941
372/38.07
(Continued)

FOREIGN PATENT DOCUMENTS

JP 2000-182796 A 6/2000
JP B-3256090 2/2002
(Continued)

*Primary Examiner* — Yuanda Zhang
(74) *Attorney, Agent, or Firm* — RatnerPrestia

(57) ABSTRACT

A constant current control power supply of an embodiment of the present invention includes a switching regulator that includes a switching circuit having a switching device and a rectifier device, a smoothing circuit having reactors and capacitors, a current detection circuit, and a control circuit, for outputting a constant current in accordance with a command value from a controller. When ON indicates a case where the command value commands an output of a higher current than a predetermined value and OFF indicates a case where the command value commands an output of a lower current than the predetermined value, on condition that a pulse operation alternating between the ON and the OFF is inputted, the control circuit amplifies a variation in the command value by a predetermined amplification factor and adds the amplified variation to the command value, and attenuates the added variation with a predetermined time constant.

2 Claims, 4 Drawing Sheets

(51) Int. Cl.
*H01S 3/10* (2006.01)
*H02M 7/217* (2006.01)
*H02M 1/00* (2006.01)

(56) References Cited

U.S. PATENT DOCUMENTS

| | | | | |
|---|---|---|---|---|
| 2010/0246227 A1* | 9/2010 | Shimizu | ............... | H02M 3/156 363/126 |
| 2013/0009475 A1* | 1/2013 | Nunoya | ............... | H02J 5/005 307/43 |
| 2013/0134893 A1* | 5/2013 | Zimmermann | .... | H05B 33/0815 315/224 |
| 2013/0162157 A1* | 6/2013 | Suzuki | ............... | H02M 7/217 315/201 |

FOREIGN PATENT DOCUMENTS

| | | |
|---|---|---|
| JP | A-2003-234534 | 8/2003 |
| JP | B-3456121 | 10/2003 |
| JP | A-2010-49523 | 3/2010 |

\* cited by examiner

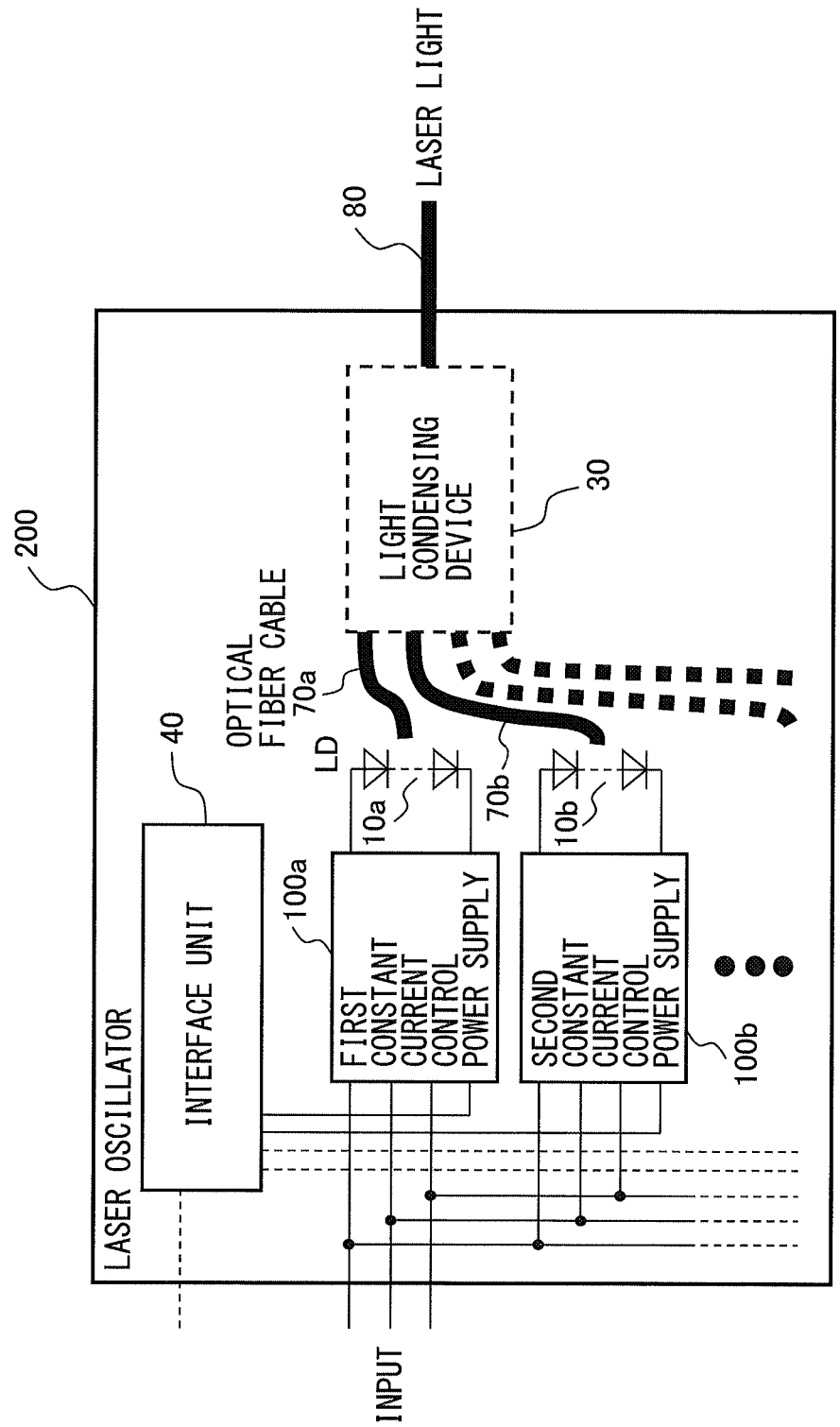

CONSTANT CURRENT CONTROL POWER SUPPLY AND LASER OSCILLATOR

BACKGROUND OF THE INVENTION

1. Field of the Invention

The present invention relates to a constant current control power supply and a laser oscillator, and more specifically relates to a constant current control power supply and a laser oscillator that sharpen rising and falling edges of an output current, while reducing a ripple current due to a disturbance variation by lowering a gain in a high frequency band in power control.

2. Description of Related Art

To drive laser diodes (LDs) used in laser oscillators, LD drive power supplies that output a constant current in accordance with a command value from a controller are necessary. The LD drive power supplies require high efficiency, a low ripple current, and a high speed response.

Regarding the requirement for high efficiency, SMPSs (switch mode power supplies), that is, so-called switching regulators are generally used to reduce a power loss (for example, Japanese Unexamined Patent Publication (Kokai) No. 2010-49523, which will be hereinafter referred to as Patent Literature 1). Contrary to this, configurations in which a constant voltage power supply and a constant current circuit are combined have worse conversion efficiency (for example, Japanese Patent No. 3256090).

A low ripple current is required of direct lasers (such as fiber lasers) because the direct lasers have a short time constant of electrical-to-optical conversion and slight current variations affect a laser output. As techniques for reducing a ripple current, there are generally known smoothing circuits having configurations in which a reactor and a capacitor are combined or added (for example, Patent Literature 1), instead of configurations having only a reactor (for example, Japanese Patent No. 3456121 and Japanese Unexamined Patent Publication (Kokai) No. 2003-234534, which are hereinafter referred to as Patent Literatures 3 and 4), to attenuate a fundamental ripple component at a switching frequency.

A high speed response is required of laser machining, which needs a pulse current of a high frequency (up to several tens of kHz), to enable (turn-on) and disable (turn-off) a laser at high speed. Thus, there are proposed a technique in which switches connected in parallel with LDs are turned on and off (for example, Patent Literatures 3 and 4), and a technique in which a switch is connected to LDs in series and an amplification factor (gain) of a difference (error amount) from a command value obtained by feedback is instantaneously raised upon turning on the switch and gradually lowered with time (for example, Patent Literature 1).

FIG. 1 is a block diagram of a conventional constant current switching power supply. The conventional constant current switching power supply, for controlling a current flowing through a load 1004, includes a switching circuit 1001, a rectifier circuit 1002, a smoothing circuit 1003, a switching device 1005 for the load, a current detection device 1006, an analog-to-digital converter (ADC) 1007, and a computing circuit 1008. The switching device 1005 switches on and off to enable and disable a current flow through the load 1004 in response to a pulse signal PS fed from a pulse generator 1009. To the computing circuit 1008, a current command Ic, which determines the value of the current flowing through the load 1004, is supplied by an external control circuit 1010.

As described above, the constant current switching power supply described in Patent Literature 1 is an appropriate example that satisfies all the requirements for high efficiency, a low ripple current, and a high speed response. However, in the case of switching on and off the switching device 1005 connected in series to the load 1004 such as LDs, as described in Patent Literature 1, there is a problem that it takes time to charge a capacitor of the smoothing circuit 1003 upon switching on. Patent Literature 1 discloses a technique for shortening the time to charge the capacitor upon switching on. However, the complicated control requires a processor such as a microcomputer or a DSP (digital signal processor). Moreover, since the processor also performs power control, a higher switching frequency requires a more expensive processor having higher computing power for a stable operation.

SUMMARY OF THE INVENTION

An object of the present invention is to provide a constant current control power supply and a laser oscillator that allow a low ripple current and a high speed response.

A constant current control power supply according to an embodiment of the present invention includes a switching regulator that includes a switching circuit having a switching device and a rectifier device, a smoothing circuit having a reactor and a capacitor, a current detection circuit, and a control circuit, for outputting a constant current in accordance with a command value from a controller. When ON indicates a case where the command value commands an output of a higher current than a predetermined value and OFF indicates a case where the command value commands an output of a lower current than the predetermined value, under a condition that a pulse operation alternating between the ON and the OFF is inputted, the control circuit amplifies a variation in the command value by a predetermined amplification factor and adds the amplified variation to the command value, and attenuates the added variation with a predetermined time constant.

BRIEF DESCRIPTION OF THE DRAWINGS

The objects, features, and advantages of the present invention will be more apparent from the following description of embodiments in conjunction with the attached drawings, wherein:

FIG. 5 shows the configuration of a laser oscillator according to an embodiment of the present invention.

DETAILED DESCRIPTION OF THE INVENTION

A constant current control power supply and a laser oscillator according to the present invention will be described below with reference to the drawings.

Figure 1:
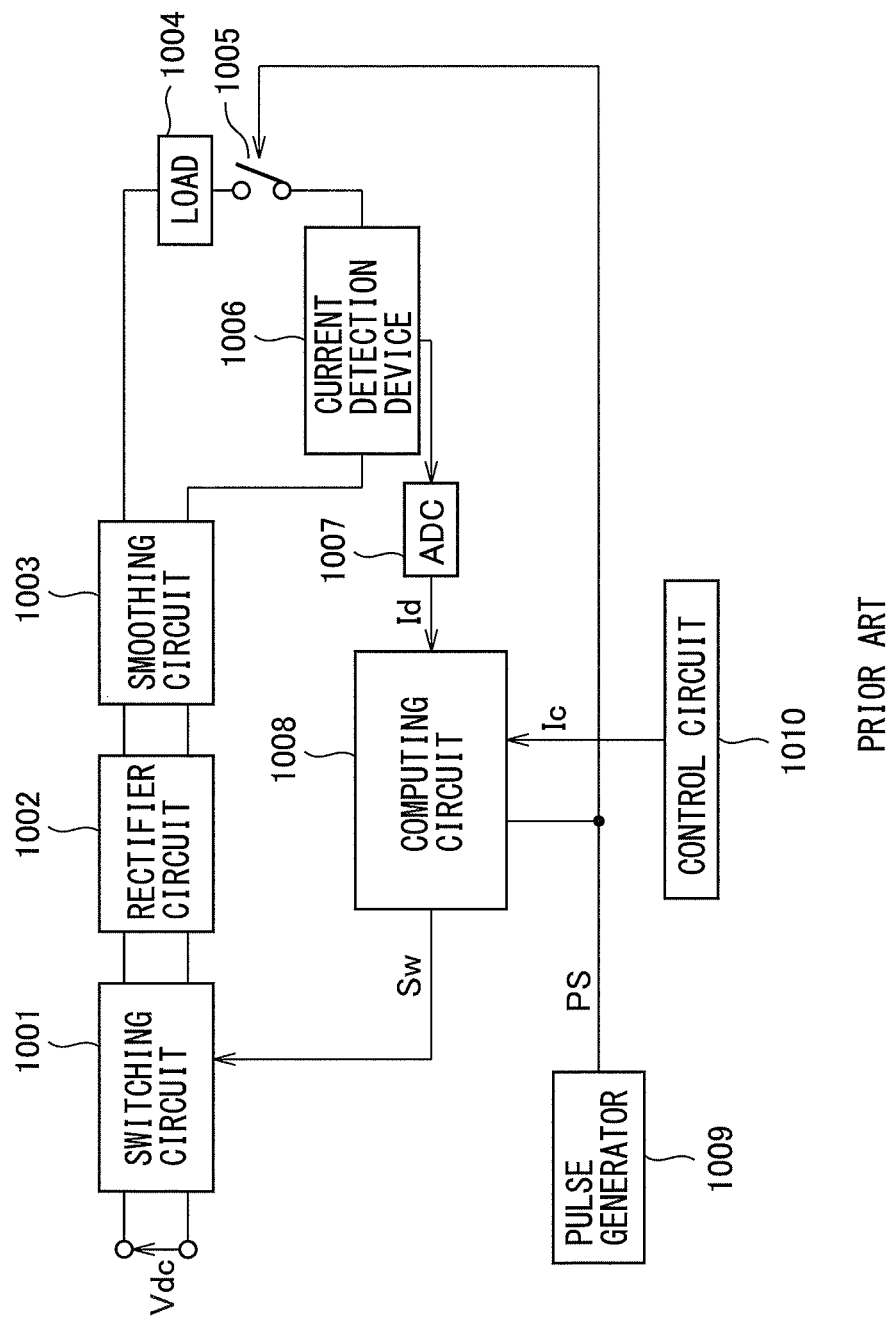
FIG. 1 is a block diagram showing a conventional constant current switching power supply.
Figure 2:
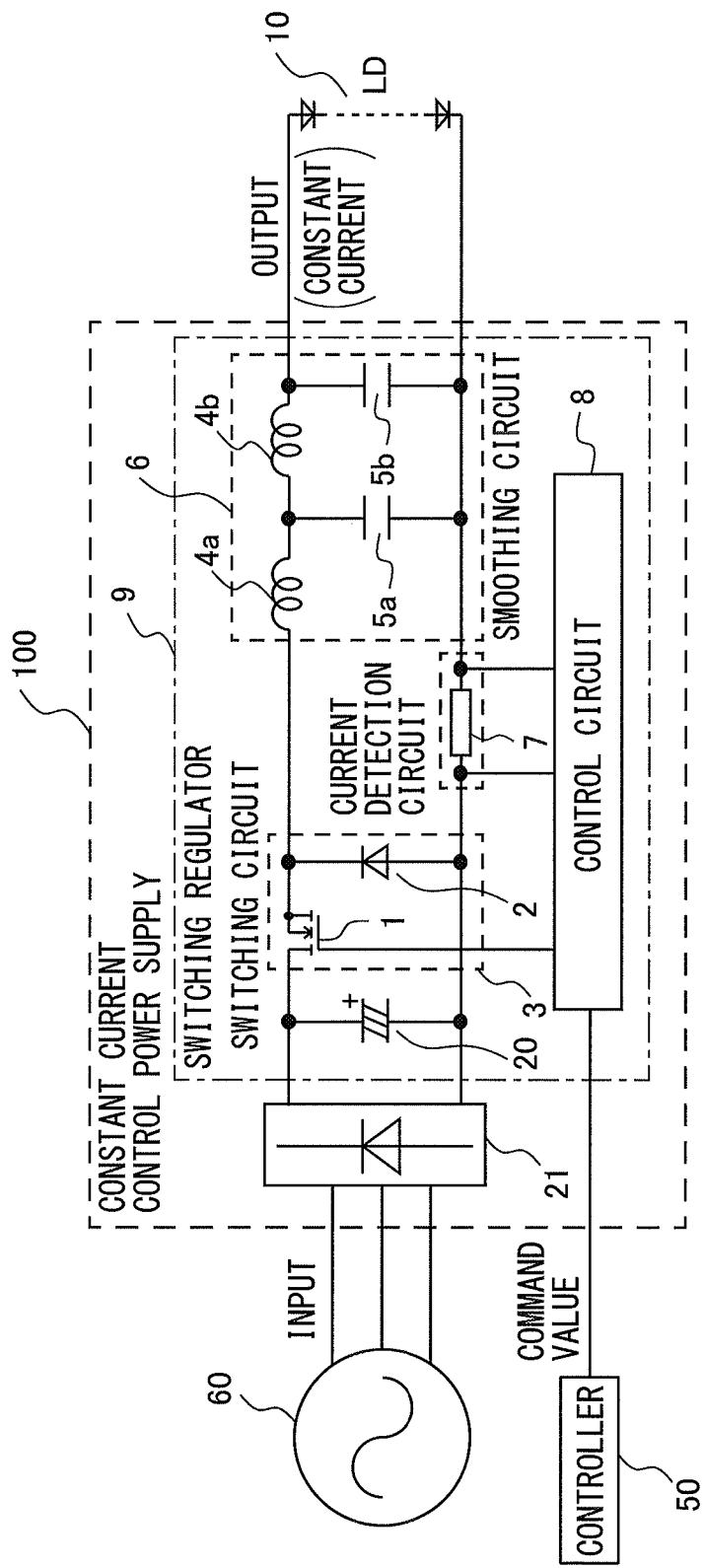
FIG. 2 is a block diagram showing the configuration of a constant current control power supply according to the present invention.

A constant current control power supply according to an embodiment of the present invention will be described. FIG. 2 is a block diagram showing the configuration of the constant current control power supply according to the embodiment of the present invention. The constant current control power supply 100 according to the embodiment of the present invention includes a switching regulator 9 that includes a switching circuit 3 having a switching device 1 and a rectifier device 2, a smoothing circuit 6 having reactors 4a and 4b and capacitors 5a and 5b, a current detection circuit 7, and a control circuit 8, for outputting a constant current in accordance with a command value from a controller 50. When ON indicates a case where the command value commands an output of a higher current than a predetermined value and OFF indicates a case where the command value commands an output of a lower current than the predetermined value, under a condition that a pulse operation alternating between the ON and the OFF is inputted, the control circuit 8 amplifies a variation in the command value by a predetermined amplification factor and adds the amplified variation to the command value, and attenuates the added variation with a predetermined time constant.

As shown in FIG. 2, the switching regulator 9 has the switching circuit 3, the smoothing circuit 6, the current detection circuit 7, and the control circuit 8. Although a non-isolated chopper power supply is taken as an example, the switching regulator 9 may be configured as an isolated forward, push-pull, half-bridge, or full-bridge switching regulator.

Next, the operation of the constant current control power supply according to the embodiment of the present invention will be described. A three-phase alternating current (AC) voltage is inputted from a three-phase AC power source 60 to a converter 21, and the AC voltage is converted into a direct current (DC) voltage therein. The converted DC voltage is smoothed by a smoothing capacitor 20. The smoothed DC voltage is inputted to the switching circuit 3.

The switching circuit 3 includes the switching device 1 and the rectifier device 2. The switching device 1 performs switching based on a signal from the control circuit 8 to turn on and off laser diodes (LDs) 10. Although a MOSFET is used as the switching device 1 in an example shown in FIG. 2, another type of semiconductor switch such as a bipolar transistor may be used instead.

The current detection circuit 7 is provided between the switching circuit 3 and the smoothing circuit 6. The current detection circuit 7 using e.g. a resistor measures a voltage and converts the measured voltage value into a current value. The current detection circuit 7 detects a current flowing through the smoothing circuit 6, and outputs a detection result to the control circuit 8.

The smoothing circuit 6 includes the reactors 4a and 4b and the capacitors 5a and 5b. The smoothing circuit 6 smooths an output of the switching circuit 3. Although two reactors and the two capacitors are provided in the example shown in FIG. 2, the number of the reactors and the number of the capacitors may be one or three or more. A constant current outputted from the smoothing circuit 6 is fed to the LDs 10.

The current flowing through the LDs 10 is in an ON state or an OFF state in accordance with the signal fed from the control circuit 8 by the control of the switching device 1. When the switching device 1 is turned on, an output current drives the LDs 10, while charging the capacitors 5a and 5b through the reactors 4a and 4b.

When the switching device 1 is turned off, energy that has been charged by the capacitors 5a, 5b and the reactors 4a, 4b flows as a current through the LDs 10. Thus, by turning on and off the switching device 1 of the switching circuit 3, the current flowing through the LDs 10 is switched between the ON state and the OFF state.

Figure 3:
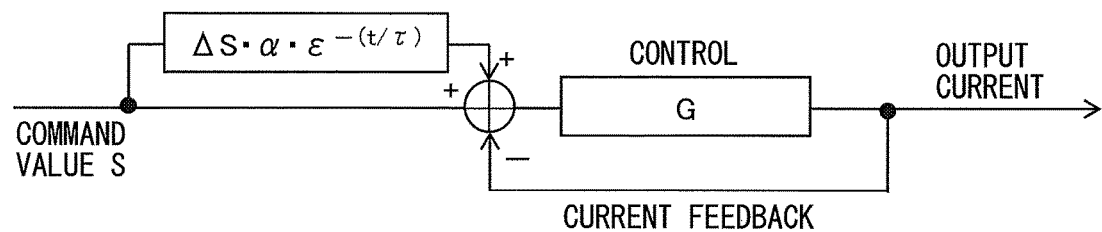
FIG. 3 is a schematic diagram of a control in which a variation in a command value is amplified by a certain decay time constant in the constant current control power supply according to the present invention.

FIG. 3 is a schematic diagram of a control in which a variation in a command value is amplified by a certain decay time constant in the constant current control power supply according to the embodiment of the present invention. When a command value S has varied at the time t=0, an amplified value (by $\alpha$ times) of a variation $\Delta S$ in the command value is added to the command value and attenuated by a time constant $\tau$ ($\Delta S \cdot \alpha \cdot \epsilon^{-(t/\tau)}$, wherein $\epsilon$ is Napier's constant). This allows a high speed response without increasing a gain in a high frequency band in power control G, thus resulting in a reduction in a current caused by a disturbance variation. An amplification circuit of the variation in the command value by the certain decay time constant can be configured with a resistor and a capacitor.

In the present invention, LDs are in an ON state or an OFF state by varying a command value from a control circuit between an ON state (a command to output a high current) and an OFF state (a command to output a low current and no laser light), instead of being turned on and off by switching, with the use of a highly efficient switching regulator. Moreover, a variation in the command value is amplified by a predetermined amplification factor and added to the command value, and the added variation is attenuated with a predetermined time constant. Thus, a low ripple current and a high speed response can be realized.

A variation in a ripple current occurring at random other than a switching frequency is triggered by a disturbance variation such as the effect of noise in a control circuit and a feedback circuit and appears in an output current from a switching circuit through a smoothing circuit. However, when a gain is high in a high frequency band in power control, since the disturbance variation is amplified, the ripple current deteriorates. On the other hand, it is apparent that the gain in the high frequency band needs to be increased to realize a high speed response.

In the present invention, a variation in a command value is amplified by a predetermined amplification factor and added to the command value, and the added variation is attenuated with a predetermined time constant. Thereby, by taking advantage of the variation in the command value from the ON state to the OFF state or from the OFF state to the ON state, the command value is transmitted to power control instantaneously in a larger manner than the actual variation, therefore it is possible to sharpen rising and falling edges of an output current. Furthermore, reducing the gain in the high frequency band in the power control serves to reduce the ripple current due to the disturbance variation.

Figure 4:
FIG. 4 shows an example of the waveform of a ripple current in the constant current control power supply according to the present invention.

FIG. 4 shows an example of the waveform of a ripple current. A fundamental ripple component having a switching period varies depending on filter constants of a reactor and a capacitor of a smoothing circuit. A disturbance variation occurs at random by being triggered by the effect of noise in a control circuit and a feedback circuit and the like. An increase in an attenuation of the filter constant reduces both of the fundamental ripple component and the disturbance variation, but hinders a high speed response.

As described above, according to the constant current control power supply according to the embodiment of the present invention, it is possible to make a configuration that reduces a ripple current, while maintaining the sharpness of rising and falling edges of an output current in response to a pulse command (maintaining a high speed response), out of inexpensive components.

Next, a laser oscillator according to an embodiment of the present invention will be described. The laser oscillator according to the embodiment of the present invention has the above-described one or more constant current control power supplies, one or more laser diode units the number of which is the same as that of outputs of the constant current control power supplies, and an interface unit for receiving an external control signal. The one or more constant current control power supplies drive the one or more laser diode units in accordance with a command value from a controller or the interface unit. When the number of the laser diode units is one, laser light is directly outputted. When the number of the laser diode units is two or more, a light condensing device condenses light emitted from the laser diode units and outputs the condensed light as laser light.

FIG. 5 shows the configuration of the laser oscillator according to the embodiment of the present invention. In the laser oscillator 200 according to the present invention, a command value is outputted from an internal or external controller to a plurality of constant current control power supplies (100a and 100b) through an interface unit 40. Light emitted from the plurality of laser diode units (10a and 10b) is transmitted through optical fiber cables (70a and 70b) to a light condensing device 30, and the condensed light is outputted as laser light through an output side optical fiber cable 80. Although the plurality of laser diode units (10a and 10b) is present in FIG. 5, the number of the laser diode units may be one (for example, 10a) instead. When the number of the laser diode units is one (single unit), the light condensing device is not necessary, and laser light is outputted directly from the laser diode unit without passing through the light condensing device.

FIG. 5 shows an example in which the two laser diode units i.e. the first laser diode unit 10a and the second laser diode unit 10b are present, and the two constant current control power supplies, i.e., the first constant current control power supply 100a and the second constant current control power supply 100b are present. However, not limited to this, the number of the laser diode units and the number of the constant current control power supplies may be three or more.

FIG. 5 shows an example in which the command value is sent from the interface unit 40 to the first constant current control power supply 100a and the second constant current control power supply 100b. However, not limited to this, the command value may be sent from a controller 50 shown in FIG. 2 to each constant current control power supply.

As described above, according to the laser oscillator according to the embodiment of the present invention, it is possible to provide a laser oscillator using a constant current control power supply in which a configuration that reduces a ripple current, while maintaining the sharpness of rising and falling edges of an output current in response to a pulse command (maintaining a high speed response), is made out of inexpensive components.

According to the constant current control power supply and the laser oscillator of the embodiments of the present invention, it is possible to provide a constant current control power supply and a laser oscillator that realize a low ripple current and a high speed response.

What is claimed is:

1. A constant current control power supply comprising:
a switching regulator including:
    a switching circuit having a switching device and a rectifier device;
    a smoothing circuit having a reactor and a capacitor;
    a current detection circuit; and
    a control circuit,
wherein the switching regulator outputs a constant current in accordance with a command value from a controller,
wherein ON indicates a case where the command value commands an output of a higher current than a predetermined value, and OFF indicates a case where the command value commands an output of a lower current than the predetermined value, and
wherein the control circuit amplifies a variation in the command value by a predetermined amplification factor and adds the amplified variation to the command value, and attenuates the added variation with a predetermined time constant under a condition that the command value for performing a pulse operation alternating between the ON and the OFF is inputted.

2. A laser oscillator comprising:
one or more constant current control power supplies according to claim 1;
one or more laser diode units the number of which is the same as that of outputs of the constant current control power supplies; and
an interface unit for receiving an external control signal,
wherein the one or more constant current control power supplies drive the one or more laser diode units in accordance with a command value from the controller or the interface unit, and
wherein when the number of the laser diode units is one, laser light is directly outputted, while when the number of the laser diode units is two or more, a light condensing device condenses light emitted from the laser diode units and outputs the condensed light as laser light.

* * * * *